(12) United States Patent
Nelson et al.

(10) Patent No.: US 11,500,488 B2
(45) Date of Patent: Nov. 15, 2022

(54) MULTIFUNCTION TOUCH-SWITCH SYSTEM

(71) Applicant: T-H Marine Supplies, LLC, Huntsville, AL (US)

(72) Inventors: John Logan Nelson, Fort Meyers, FL (US); Read Hamilton Samples, Fort Meyers, FL (US)

(73) Assignee: T-H Marine Supplies, LLC, Huntsville, AL (US)

( * ) Notice: Subject to any disclaimer, the term of this patent is extended or adjusted under 35 U.S.C. 154(b) by 0 days.

(21) Appl. No.: 17/376,325

(22) Filed: Jul. 15, 2021

(65) Prior Publication Data

US 2022/0019310 A1    Jan. 20, 2022

Related U.S. Application Data

(60) Provisional application No. 63/052,213, filed on Jul. 15, 2020.

(51) Int. Cl.
*G06F 3/041* (2006.01)
*G06F 3/044* (2006.01)

(52) U.S. Cl.
CPC ............ *G06F 3/0416* (2013.01); *G06F 3/044* (2013.01)

(58) Field of Classification Search
None
See application file for complete search history.

(56) References Cited

U.S. PATENT DOCUMENTS

2011/0104963 A1\* 5/2011 Ellis ..................... G01C 21/203
440/6

\* cited by examiner

*Primary Examiner* — Stephen T. Reed
(74) *Attorney, Agent, or Firm* — Stephen H. Hall; Andrew Tuggle; Bradley Arant Boult Cummings LLP

(57) ABSTRACT

A multifunction touch-switch system is provided. The multifunction touch-switch system is configured to control devices (for example LED lighting) by a touch switch. The multifunction touch-switch system may be configured to be waterproof and vibration resistant for use in a marine environment, for example aboard a marine vehicle. The multifunction touch-switch system may be configured to control multiple functions of multiple devices with a single touch sensor. In addition to a controller and a housing for the controller, the multifunction touch-switch system may also comprise an indicator light.

18 Claims, 15 Drawing Sheets

| Input to the touch sensor | Output state | Indicator state |
|---|---|---|
| Zero touches | Off | Off |
| One tap | On---10% | On |
| Two taps | On---50% | On |
| Three taps | On---100% | On |
| Four taps (or tap-and-hold) | Off | Off |

FIG. 3A

| Input to the touch sensor | First output state | Second output state | Indicator state |
|---|---|---|---|
| Untouched | Off | Off | Off |
| Tapped once | On | Off | On---red |
| Tapped twice | Off | On | On---blue |
| Tapped thrice | On | On | On---green |
| Held | Off | Off | Off |

FIG. 3B

| Use-case | Most recently touched touch sensor | Output state | First indicator state | Second indicator state |
|---|---|---|---|---|
| Up-Down | First touch sensor | Up | On | Off |
| | Second touch sensor | Down | Off | On |
| On-Off | First touch sensor | On | On | Off |
| | Second touch sensor | Off | Off | On |
| Navigation | First touch sensor | Bow | On | Off |
| | Second touch sensor | Stern | Off | On |

| Input to the touch sensor | Output state | | | | | | | | | |
|---|---|---|---|---|---|---|---|---|---|---|
| | On-Off | Momentary | Dual Device | Navigation Light | Light | Light Controller | Bilge Pump | Baitwell Pump | Baitwell Timer | Intermittent |
| One tap | On | Momentary on | First device on | Bow and stern lights on | On-25% | Preset color | On | On-25% | 1 minute | Low |
| Two taps | Off | | Second device on | Stern light on | On-50% | Off | Auto | On-50% | 2 minutes | High |
| Three taps | | | Off | Off | On-75% | | Off | On | 3 minutes | Off |
| Four taps | | | | | On | | | Off | 4 minutes | |
| Tap-and-hold | | | First and second devices on | | On | Color select | | Variable speed | Constant on | |

MULTIFUNCTION TOUCH-SWITCH SYSTEM

CROSS-REFERENCE TO RELATED APPLICATIONS

This application claims the benefit of and priority to U.S. Provisional Patent Application No. 63/052,213, filed Jul. 15, 2020, and entitled "Multifunction Touch-Switch System," the contents of which are hereby incorporated by reference herein in their entirety.

FIELD OF INVENTION

This disclosure relates generally to marine electronics, in particular, electronic systems for controlling devices aboard marine vehicles. Uses for this apparatus may include but are not limited to: controlling lighting systems aboard a marine vehicle; controlling other devices aboard a marine vehicle; providing feedback to a user about the status of lighting or other devices aboard a marine vehicle; and providing waterproof and vibration-resistant housing for such controls.

BACKGROUND

Watercraft and marine systems incorporate a variety of components that an operator may need to control and modify during use. These can include propulsion, navigation, control, power, and lighting systems. Control interfaces for these functions are frequently grouped together on a panel and placed in a location convenient for a watercraft's operator to access.

Traditional watercraft systems use push-button switches or latching switches (e.g., panel switches, rocker switches, or toggle switches) to controller functions. These switches have moving components that make and break physical contacts to actuate outputs from the switch. Such mechanically moving parts can wear out through use and are also degraded by mechanical shocks and vibrations, such as are present in a marine environment. In addition, these switches frequently are configured to control a single system functionality or device operation. Without multifunctional switches, systems can require as many switches as there are devices or functions to control.

Touch switches (also known as conductive-touch or capacitive-touch switches) detect contact by a user's finger and therefore need no moving parts. As a result, these switches can be more durable, have longer maintenance intervals, and have greater in-service time before replacement is needed. In addition, because touch switches are not limited to a small number of mechanical configurations (e.g., up and down), touch switches overcome the challenge of making switch systems to control multiple devices with multiple functions. Controllers and microcontrollers (for example integrated-circuit controllers) further allow for programmability and multiple functions, expanding a switch's ability to control multiple devices.

There are unique challenges to bringing these solutions to marine environments, especially aboard marine vehicles. For example, electrical and electronic systems are easily damaged by water, including saltwater. Further, marine environments are wracked by shock and vibration. Lack of moving parts can help protect against shock and vibration, but the components necessary for a touch-switch system (especially a multifunction touch-switch system) also present unique challenges when it comes to waterproofing. Specifically, the electrical components (i.e. controller, printed circuit board) would not be expected to fit within traditional waterproof, vibration-resistant housings. In addition, touch switch controllers are sensitive to input polarity and circuit overloading, by which they can be damaged.

Improved techniques for providing programmable or multifunction switch systems that can control lighting systems and multiple other devices with multiple functions in a marine environment are generally desirable.

SUMMARY OF THE INVENTION

The present disclosure describes a multifunction touch-switch system. In a first exemplary embodiment, a system is disclosed, comprising: a power supply; a waterproof housing body; a controller positioned substantially within the housing body, wherein the controller comprises a touch sensor, a microcontroller, a printed circuit board, and at least one output interface, and wherein the controller comprises instructions which, when executed by the controller, are configured to determine an output state of the at least one output interface, wherein the determination is made according to an output rule and based on an input to the touch sensor; and wherein the controller is configured to be coupled to the power supply and to at least one output device to form an electrical circuit.

In a second exemplary embodiment, a system is disclosed, comprising: a power supply; a waterproof housing body, wherein the housing body is threaded; a nut; a washer; a controller positioned substantially within the housing body, wherein the controller comprises a touch sensor, a microcontroller, a printed circuit board, and at least one output interface, and wherein the controller comprises instructions which, when executed by the controller, are configured to determine an output state of the at least one output interface, wherein the determination is made according to an output rule and based on an input to the touch sensor; and wherein the controller is configured to be coupled to the power supply and to at least one output device to form an electrical circuit.

In a third exemplary embodiment, a system is disclosed, comprising: a power supply; a waterproof housing body, wherein the housing body is threaded; a nut; a washer; a controller positioned substantially within the housing body, wherein the controller comprises a touch sensor, a microcontroller, a printed circuit board, and at least one output interface, and wherein the controller comprises instructions which, when executed by the controller, are configured to determine an output state of the at least one output interface, wherein the determination is made according to an output rule and based on an input to the touch sensor; and wherein the controller is configured to be coupled to the power supply and to at least one output device to form an electrical circuit; wherein the system has an Ingress Protection code of at least IP67.

In a fourth exemplary embodiment, a system is disclosed, comprising: a power supply; a waterproof housing body having a plurality of spring clips; a controller positioned substantially within the housing body, wherein the controller comprises at least two touch sensors, a microcontroller, a printed circuit board, and at least one output interface, and wherein the controller comprises instructions which, when executed by the controller, are configured to determine an output state of the at least one output interface, wherein the determination is made according to an output rule and based on an input to the touch sensor; and wherein the controller is configured to be coupled to the power supply and to at least one output device to form an electrical circuit.

In a fifth exemplary embodiment, a system is disclosed, comprising: a multifunction touch switch comprising: a waterproof housing body; a controller positioned substantially within the housing body, wherein the controller comprises a touch sensor, a microcontroller, a printed circuit board, and at least one output interface, and wherein the controller comprises instructions which, when executed by the controller, are configured to determine an output state of the at least one output interface, wherein the determination is made according to an output rule and based on an input to the touch sensor; at least one resource adapted to be coupled to the multifunction touch switch and to be controlled by an output interface according to its output state; and wherein the controller is configured to be coupled to a power supply and to at least one output device to form an electrical circuit.

BRIEF DESCRIPTION OF THE DRAWINGS

The following drawings are attached to—and form a portion of—this disclosure:

FIG. 3A is a chart depicting both an output rule and an indicator rule of an embodiment of the multifunction touch-switch system.

FIG. 3B is a chart depicting both an output rule and an indicator rule of an embodiment of the multifunction touch-switch system.

FIG. 8 is a chart depicting an output rule of an embodiment of the multifunction touch-switch system.

FIG. 9 is a chart depicting output rules of an embodiment of the multifunction touch-switch system.

DEFINITIONS

Figure 1:
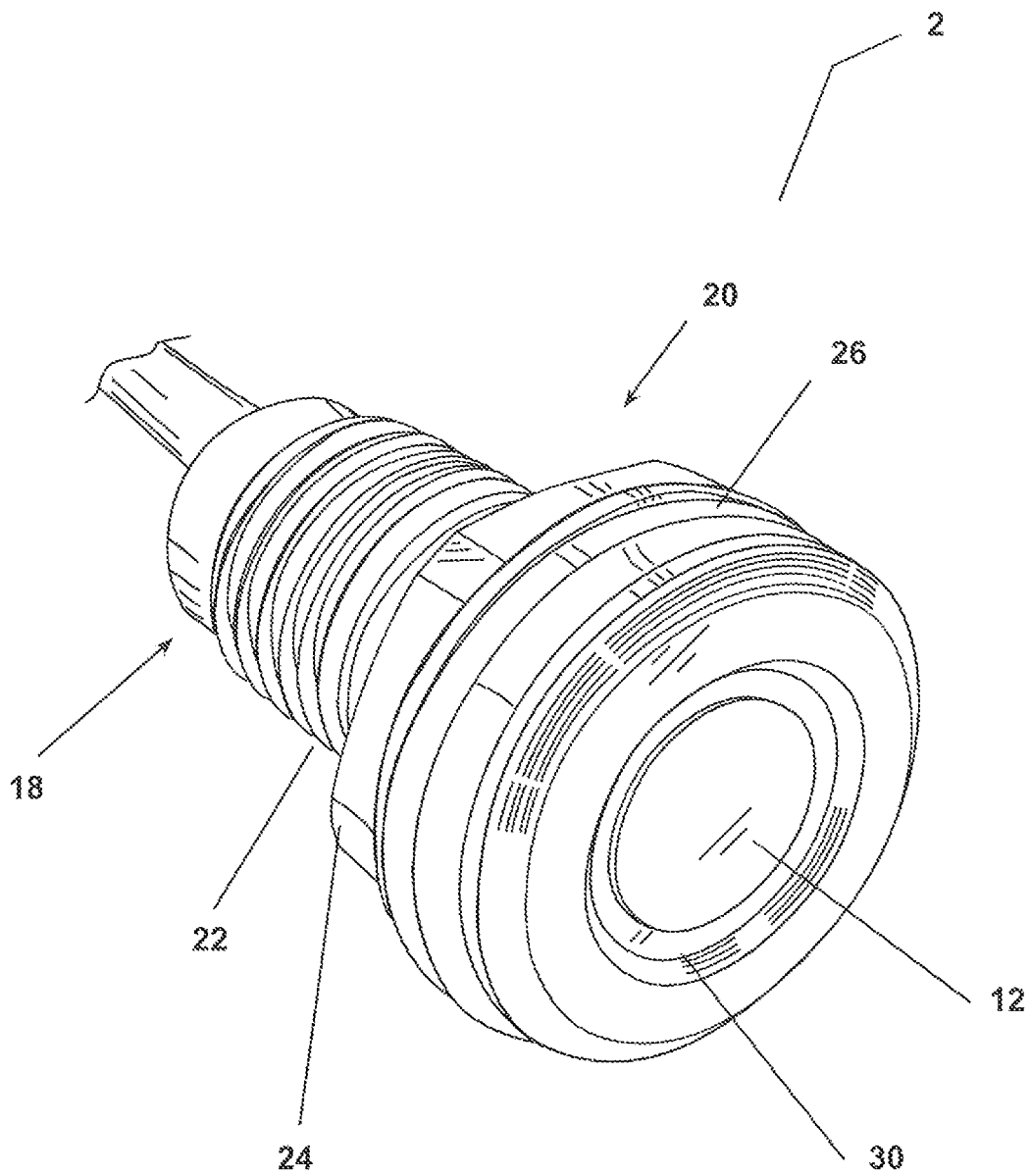
FIG. 1 is a perspective view of an embodiment of the multifunction touch-switch system.

Unless otherwise defined, all terms (including technical and scientific terms) in this disclosure have the same meaning as commonly understood by one of ordinary skill in the art of this disclosure. It will be further understood that terms, such as those defined in commonly used dictionaries, should be interpreted as having a meaning that is consistent with their meaning in the context of the specification and should not be interpreted in an idealized or overly formal sense unless expressly defined otherwise in this disclosure. For brevity or clarity, well known functions or constructions may not be described in detail.

The terms "about" and "approximately" shall generally mean an acceptable degree of error or variation for the quantity measured in light of the nature or precision of the measurements. Typical, exemplary degrees of error or variation are within 20 percent (%), preferably within 10%, more preferably within 5%, of a given value or range of values. Numerical quantities given in this description are approximate unless stated otherwise, meaning that the term "about" or "approximately" can be inferred when not expressly stated.

The terminology used throughout the disclosure is for the purpose of describing particular embodiments only and is not intended to be limiting. The singular forms "a," "an," and "the" are intended to include the plural forms as well, unless the context clearly indicates otherwise.

The terms "first," "second," and the like are used to describe various features or elements, but these features or elements should not be limited by these terms. These terms are only used to distinguish one feature or element from another feature or element. Thus, a first feature or element discussed below could be termed a second feature or element, and similarly, a second feature or element discussed below could be termed a first feature or element without departing from the teachings of the disclosure. Likewise, terms like "top" and "bottom"; "front" and "back"; and "left" and "right" are used to distinguish certain features or elements from each other, but it is expressly contemplated that a top could be a bottom, and vice versa.

The term "consisting essentially of" means that, in addition to the recited elements, what is claimed may also contain other elements (steps, structures, ingredients, components, etc.) that do not adversely affect the operability of what is claimed for its intended purpose as stated in this disclosure. This term excludes such other elements that adversely affect the operability of what is claimed for its intended purpose as stated in this disclosure, even if such other elements might enhance the operability of what is claimed for some other purpose.

It is to be understood that any given elements of the disclosed embodiments of the invention may be embodied in a single structure, a single step, a single substance, or the like. Similarly, a given element of the disclosed embodiment may be embodied in multiple structures, steps, substances, or the like.

The following description illustrates and describes the processes, machines, manufactures, compositions of matter, and other teachings of the present disclosure. The disclosure shows and describes only certain embodiments of the processes, machines, manufactures, compositions of matter, and other teachings disclosed; but as mentioned above, it is to be understood that the teachings of the present disclosure are capable of use in various other combinations, modifications, and environments and are capable of changes or modifications within the scope of the teachings of this disclosure, commensurate with the skill and knowledge of a person having ordinary skill in the relevant art. The embodiments described are further intended to explain certain best modes known of practicing the processes, machines, manufactures, compositions of matter, and other teachings of the disclosure and to enable others skilled in the art to utilize the teachings of the disclosure in such, or other, embodiments and with the various modifications required by the particular applications or uses. Accordingly, the processes, machines, manufactures, compositions of matter, and other teachings of the present disclosure are not intended to limit the exact embodiments and examples disclosed herein. Any section headings herein are provided only for consistency with the suggestions of 37 C.F.R. § 1.77 or otherwise to provide organizational cues. These headings shall not limit or characterize the invention(s) set forth herein.

DETAILED DESCRIPTION

A multifunction touch-switch system has been developed and is described. As shown in the drawings, we generally discuss embodiments of the multifunction touch-switch system for use in marine environments, e.g. aboard marine vehicles. Variations could be advantageously used in many types of environments or vehicles. In other words, the teachings of this disclosure may be advantageous for controlling lighting or other devices with a touch switch.

FIG. 1 shows a multifunction touch-switch system 2 in accordance with some embodiments of the present disclosure. The multifunction touch-switch system 2 may comprise a controller 10 (not fully shown in FIG. 1, but fully shown in and described below with respect to FIGS. 2A and 2B), a touch sensor 12, at least one control output interface 18, and a housing 20. As shown in FIG. 1, in some embodiments the housing 20 may comprise a housing body 22, nut 24, and washer 26. As shown in FIG. 1, an indicator light 30 may be positioned adjacent to a surface of the touch sensor 12. The components of the multifunction touch-switch system 2 shown in the embodiment of FIG. 1 are described in further detail below. The multifunction touch-switch system 2 may include other components in other embodiments. Additional details, features, and elements of the multifunction touch-switch system 2 are shown in FIGS. 1-5 and in the Appendix to the above-referenced U.S. Provisional Patent Application No. 63/052,213, the contents of which are incorporated by reference herein in their entirety.

Figure 2A:
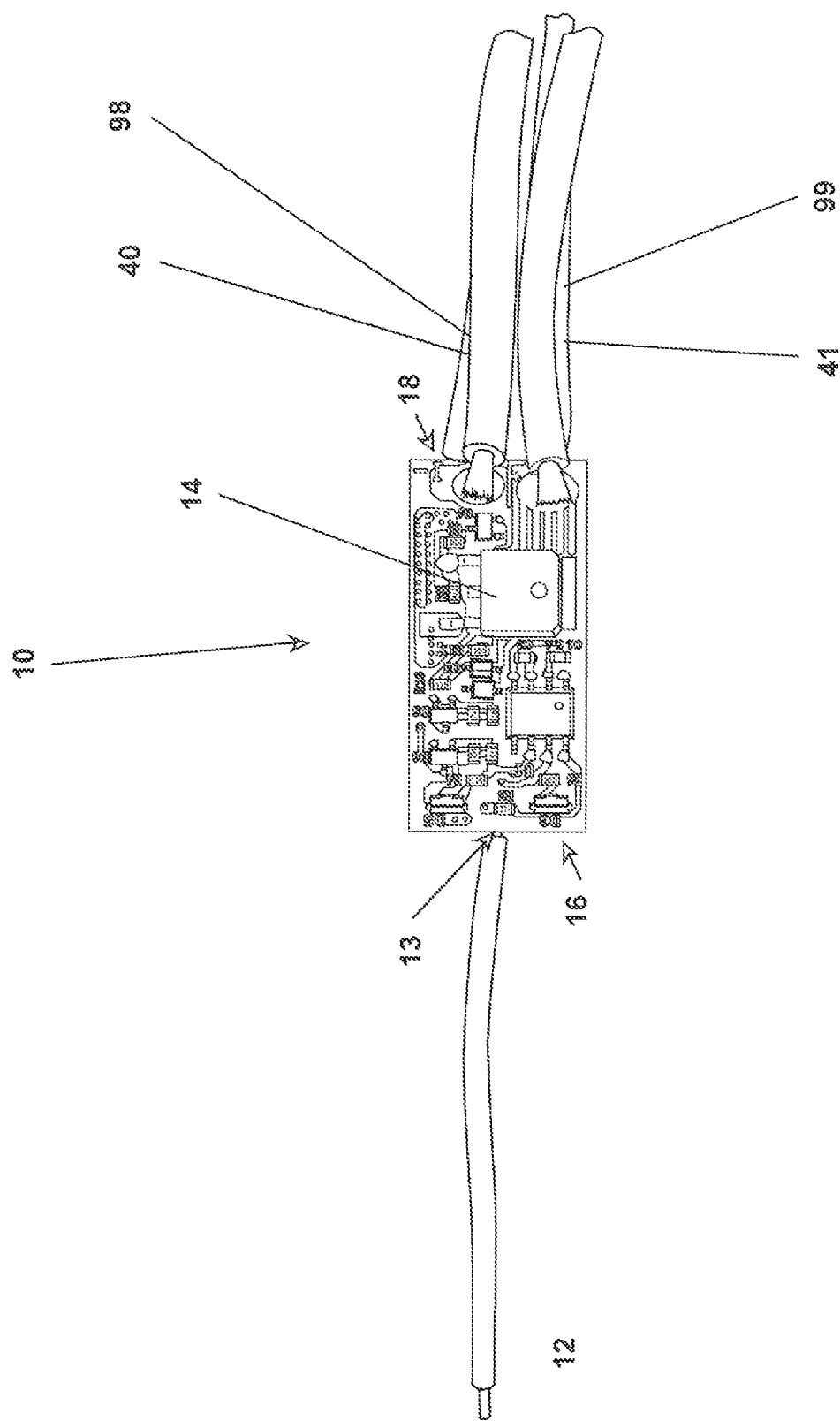
FIG. 2A is a view of the controller of an embodiment of the multifunction touch-switch system.

In some embodiments, as shown in FIG. 2A, the controller 10 comprises a microcontroller 14, which is positioned on a printed circuit board (PCB) 16 (shown in more detail in FIG. 2B) and includes at least one processor. As used herein, "processor" may include one or more processors having processing capability necessary to perform the processing functions described herein, including but not limited to hardware logic, computer readable instructions running on a processor, or any suitable combination thereof. A processor may run software to perform the operations described herein, including software accessed in machine readable form on a tangible non-transitory computer readable storage medium, as well as software that describes the configuration of hardware such as hardware description language (HDL) software used for designing chips.

The controller 10 may have at least one control output interface 18 positioned on PCB 16, described further below. The controller 10 is coupled communicatively with touch sensor 12 and may be configured to receive touch signal inputs from the sensor 12 via at least one touch input interface 13. In some embodiments, the controller 10 connects to a power source (not shown). In some embodiments, the controller 10 is configured to receive from the power direct-current power, e.g., at approximately 12 volts or at approximately 24 volts. In some embodiments, the controller 10 is configured to be reverse-polarity protected. In some embodiments, the controller 10 is configured to be voltage-limit protected, for example voltage-limit protected above approximately 26 volts. In some embodiments, the controller 10 is configured to be current-overload protected, for example current-overload protected above approximately 7.4 amperes. In some embodiments, as shown FIG. 2B, the controller may be power-side-switched (or high-side-switched) with respect to the touch sensor 12. In some embodiments, these additional features might make such a system safer or easier to install or maintain.

Figure 5:
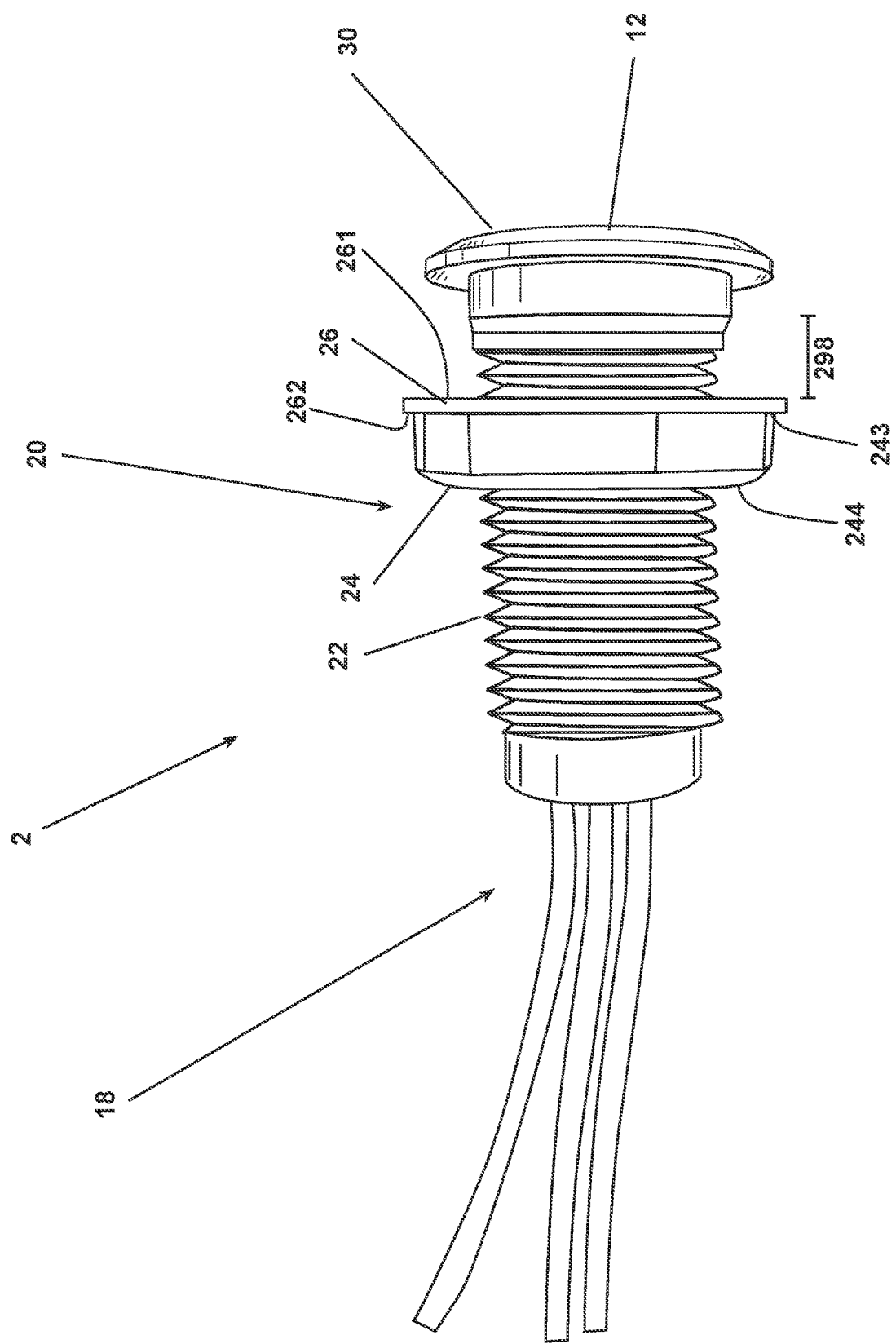
FIG. 5 is a side perspective view of an embodiment of the multifunction touch-switch system.
Figure 6:
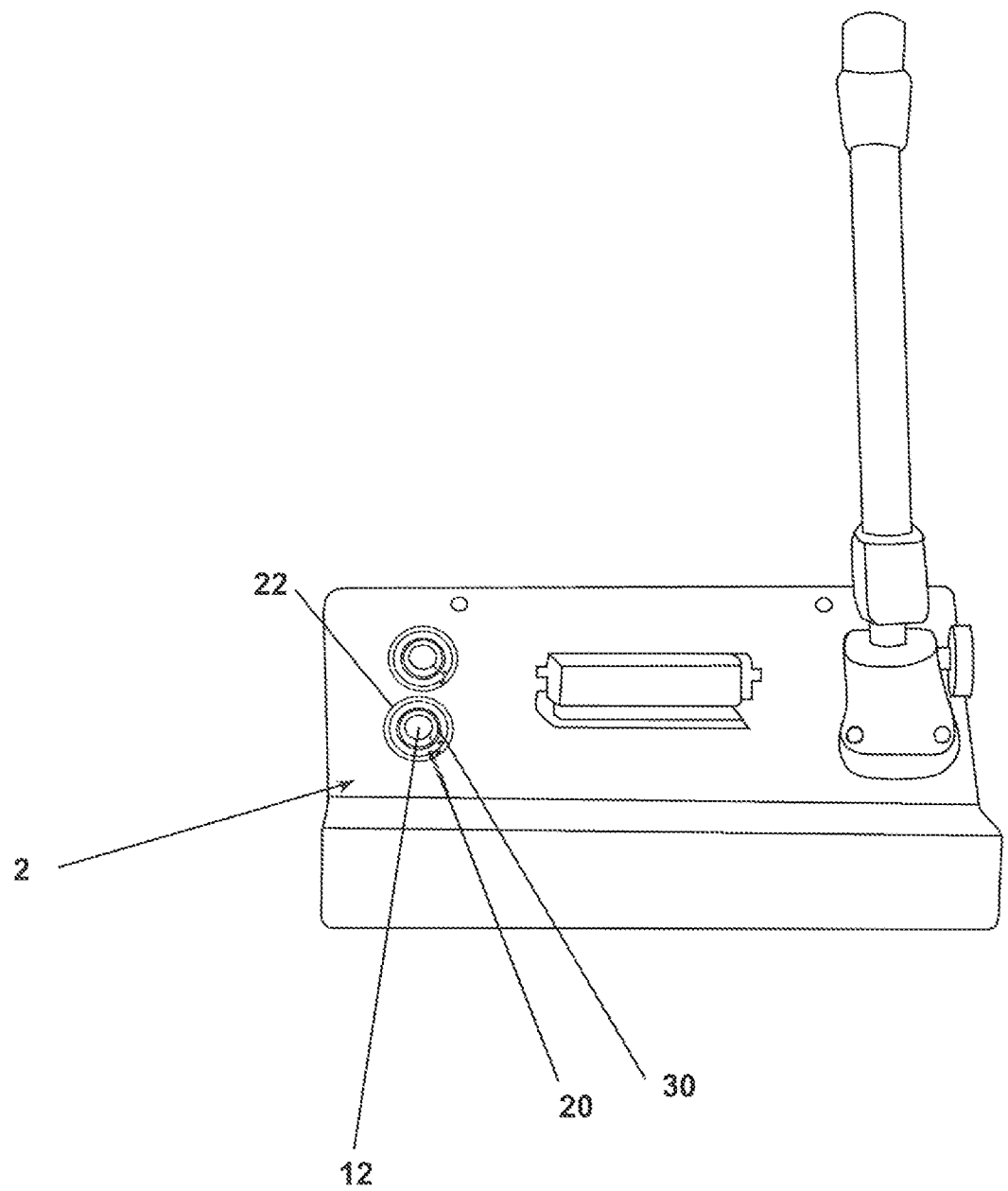
FIG. 6 is a front view of a dashboard into which is incorporated an embodiment of the multifunction touch-switch system.

In some embodiments, the touch sensor 12 may be an electrical or electronic element which receives or detects contact by a user's finger, for example a touch, a tap, or a tap-and-hold. (For purposes of this disclosure: a "tap" is a short-duration contact by a user's finger, e.g., a contact lasting less than approximately 1.5 seconds; a "tap-and-hold" is a long-duration contact by a user's finger, e.g., a contact lasting more than approximately 2 seconds.) The touch sensor 12 may receive or detect contact by a user's finger through any suitable means. For example, the touch sensor 12 may receive or detect a change in resistance or capacitance. The touch sensor 12 may be any suitable touch sensor, e.g., a surface-capacitive-sensing touch sensor or a projected-capacitive-sensing touch sensor. In some embodiments, as shown in FIG. 2A, the touch sensor 12 may terminate as a free end of an electrical wire. In other embodiments—as shown in FIGS. 1, 5, and 6—the touch sensor 12 may terminate as an electrically conductive disc, plate, or annulus. Other configurations for the touch sensor 12 may be possible in other embodiments.

In some embodiments, each of the at least one control output interface 18 may be in communication with one or more resources of the watercraft, as shown for example in FIG. 6. Such resources could include, for examples: lights, light-emitting diodes (as shown in FIG. 6), speakers, horns, radios, or other devices. The control output interface 18 may be configured as one or more wired or wireless communication interfaces, although in the embodiment of FIG. 2A, the control output interface 18 comprises a plurality of pins of the PCB 16 configured for communication via one or more wires, such as wires 98 and 99 of FIG. 2A. The control output interface 18 may include other components in some embodiments, including a signal-conducting channel, for example Bluetooth®, Near-Field Communication (NFC) or other inductive coupling or radio-frequency (RF) link. In some embodiments, the controller 10 may comprise at least two control output interfaces 18, for example a first control output interface 40 and a second control output interface 41, as shown in FIG. 2A.

Each control output interface 18 may have an associated output state 19, as depicted in FIG. 3. For example, in an embodiment like that in FIG. 2A having a first control output interface 40 and a second control output interface 41, the first control output interface 40 may have an associated first output state 42 and the second control output interface 41 may have an associated second output state 43. Note that the output state 19 could be one or more signals, for example a voltage, a current, a duty cycle, or a frequency of electrical oscillation in some embodiments.

The one or more output states 19 may be determined by the controller 10 according to an output rule 44 (see FIG. 3). An output rule 44 may be various types of logic configured to achieve the functionality ascribed to the controller 10 and its resources herein. In some embodiments, the output rule 44 may be implemented in hardware, software and various combinations thereof, although in the embodiment of FIGS. 1-5, the output rule 44 is implemented in hardware. In other embodiments, an output rule 44 may be implemented in software and stored in memory of the controller 10 (not specifically shown). As used herein, memory may refer to a tangible or non-transitory storage medium. Examples of tangible (or non-transitory) storage media include disks, thumb drives, and memory, etc., but do not include propagated signals. Tangible computer readable storage media include volatile and non-volatile, removable and non-removable media, such as computer readable instructions, data structures, program modules or other data. Examples of such media include RAM, ROM, EPROM, EEPROM, SRAM, flash memory, disks or optical storage, magnetic storage, or any other non-transitory medium that stores information that is accessed by a processor or computing device.

In some embodiments, the output rule 44 may be a correlation of at least one output state 19 with inputs to the touch sensor 12. For example—with reference to the output rule 44 shown in FIG. 3A—an output rule 44 may determine, based on a number of times which the touch sensor 12 receives a user's touch (e.g., one or more "taps" or "tap-and-holds") and provides a touch input signal to PCB 16 and microcontroller 14 via touch input signal interface 13, that the output state 19 is a voltage which is an approximately specified percentage of a maximum or desired voltage measurement. For example, the output rule 44 may include instructions that when executed by the microcontroller 14, cause the microcontroller 14 to perform operations comprising at least complying with rules specifying that: (1) when the touch sensor 12 has detected zero taps, an output state 19 is set to an "off" state, thereby turning "off" a resource coupled to receive the output state 19; (2) when the touch sensor 12 has received only one tap, the output state 19 may be a voltage approximately 10% of a maximum or desired voltage, thereby controlling the resource to operate at a level corresponding to operation using approximately 10% of a maximum or desired voltage; (3) when the touch sensor 12 has received two taps, the output state 19 is a voltage approximately 50% of a maximum voltage, thereby controlling the resource to operate at a level corresponding to operation using approximately 50% of a maximum or desired voltage; (4) when the touch sensor 12 has received three taps, the output state 19 is a voltage approximately 100% of a maximum voltage, thereby controlling the resource to operate at a level corresponding to operation using approximately 100% of a maximum or desired voltage; and (5) when the touch sensor 12 has received either four taps or a tap-and-hold, the output state 19 is such that the resource returns to an "off" state. When an output rule 44 returns the output state 19 to its initial state after a specific number of inputs, such a rule may be referred to as dependent upon a cycle of that number of inputs. For example, the output rule 44 which is shown in FIG. 3A is dependent upon a cycle of at least three inputs. Other input-to-cycle correlations are possible in some embodiments.

An additional example of an output rule 44 is shown in FIG. 3B, which depicts an embodiment having a first output state 42 and a second output state 43. In FIG. 3B an output rule 44 includes instructions that when executed by the microcontroller 14, cause the microcontroller 14 to perform operations comprising at least complying with rules specifying that: (1) when the touch sensor 12 has received zero taps, then both the first output state 42 and the second output state 43 are such that the resources are off; (2) when the touch sensor 12 has received one tap, then only the first output state 42 is such that its associated output turns on a resource; (3) when the touch sensor 12 has received two taps, then only the second output state 43 is such that its associated output turns on a resource; (4) when the touch sensor 12 has received three taps, then both the first output state 42 and the second output state 43 are such that their associated outputs each turn on a resource; and (5) when the touch sensor 12 has received either four taps or a tap-and-hold, then both the first output state 42 and the second output state 43 are such that the resources are off. In other embodiments, the output rule 44 may be any other correlation between any number of inputs to the touch sensor 12 with any number of output states 19. An output rule 44 may be as simple or as complicated as necessary to achieve a desired overall function of the multifunction touch-switch system 2. In some embodiments, the output rule 44 may involve a timer or timing sequence. In some embodiments, other functionality and features may be included as steps of an output rule 44, as may be apparent to one of ordinary skill upon reading of this disclosure.

Figure 2B:
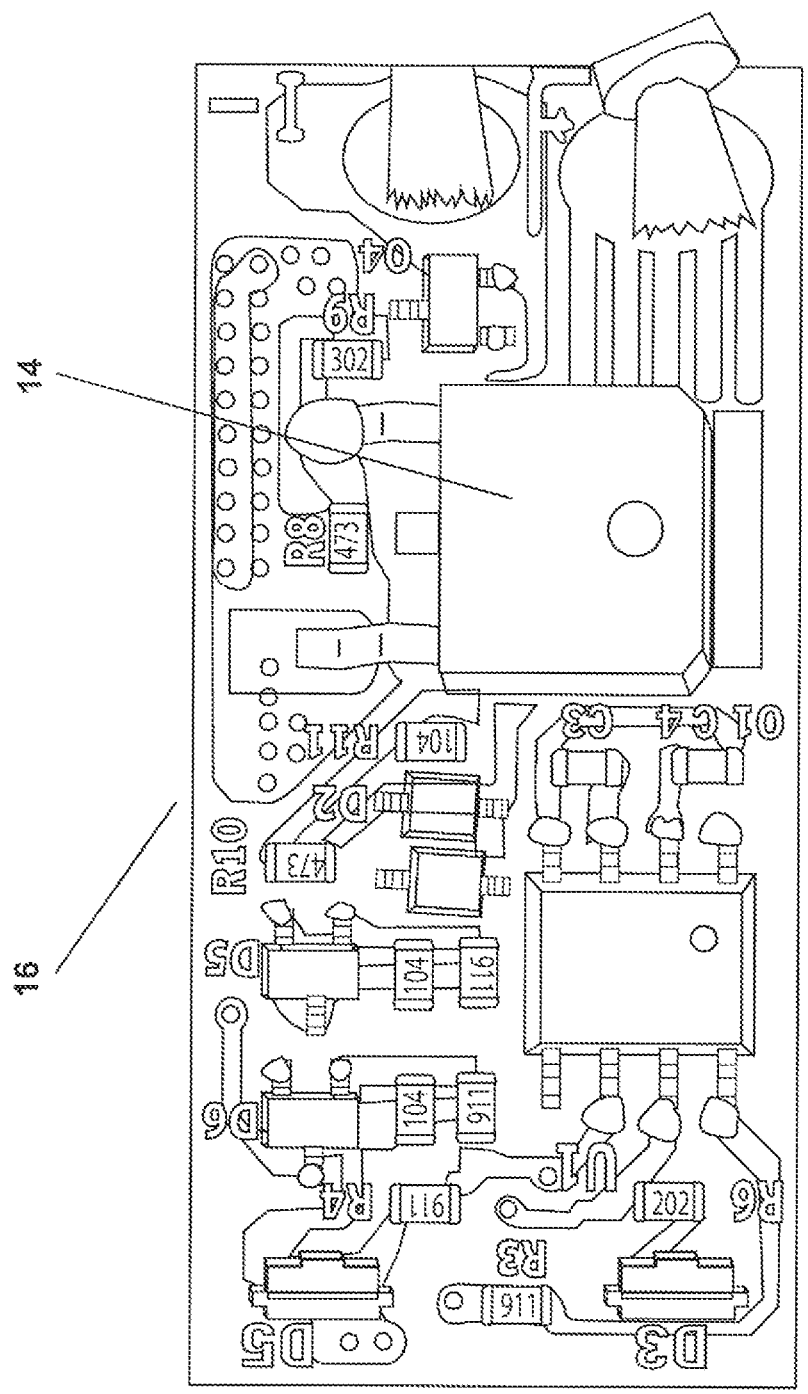
FIG. 2B is a detail view of the printed circuit board of an embodiment of the multifunction touch-switch system.
Figure 4A:
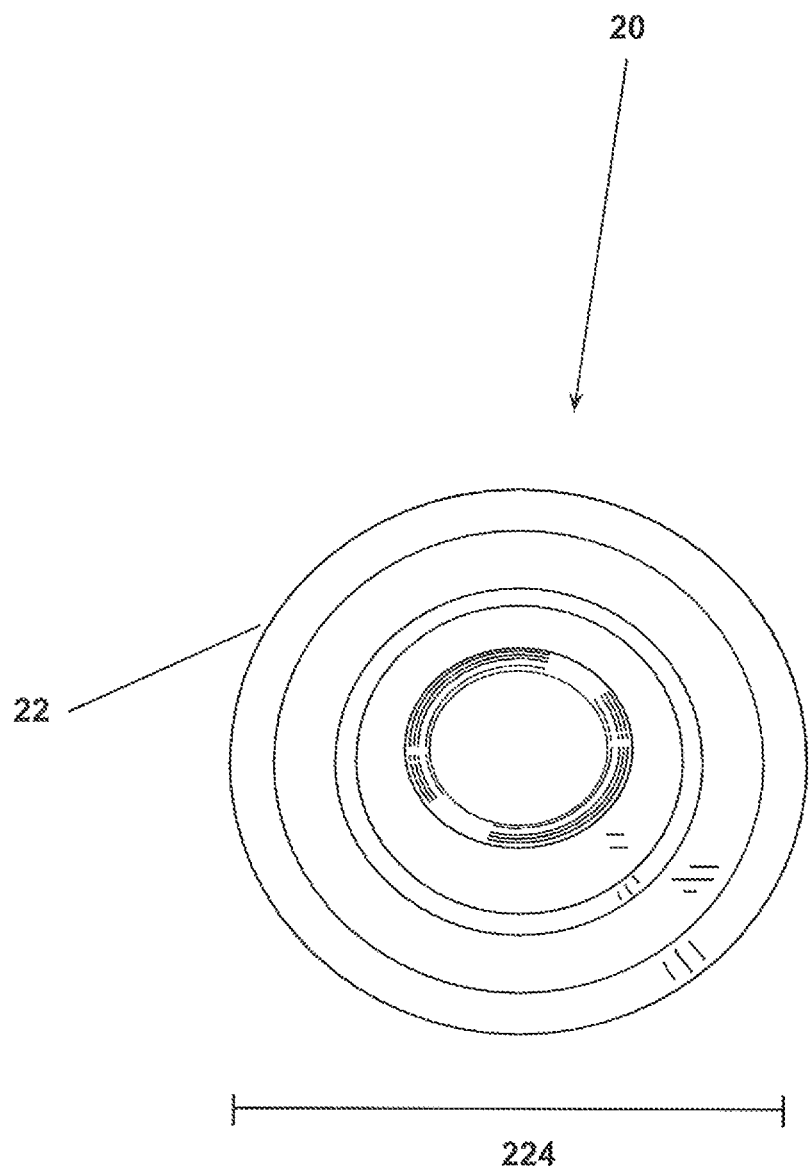
FIG. 4A is a top view of the housing body of an embodiment of the multifunction touch-switch system.
Figure 4B:
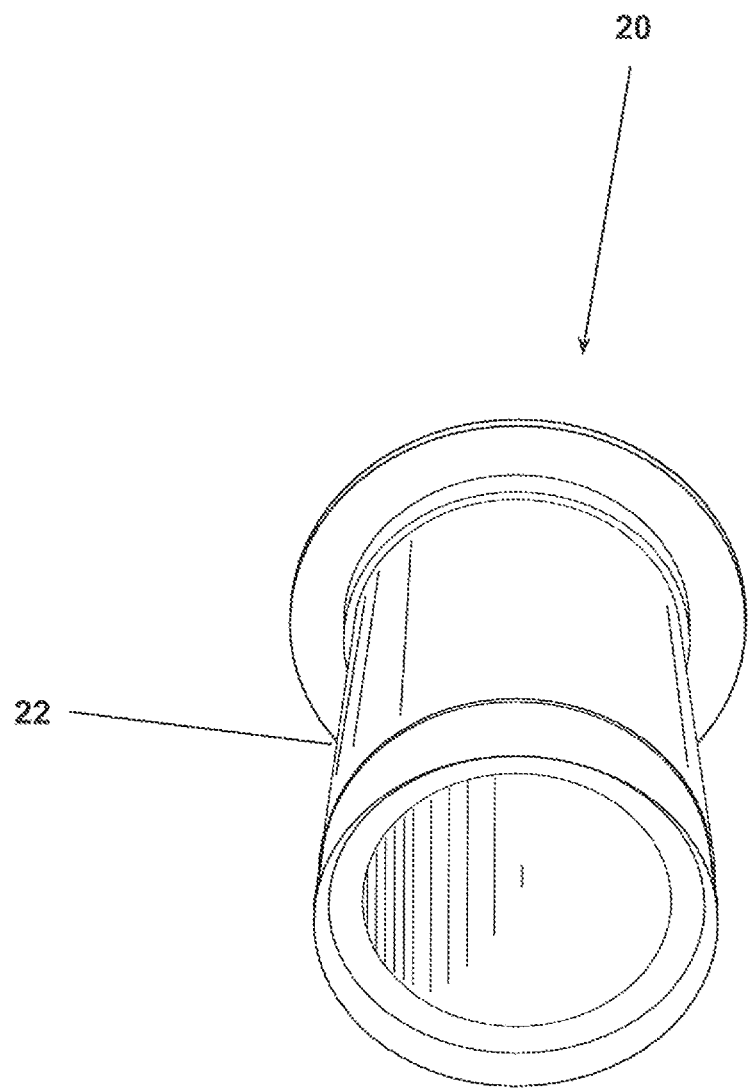
FIG. 4B is a bottom perspective view of the housing body of an embodiment of the multifunction touch-switch system.
Figure 4C:
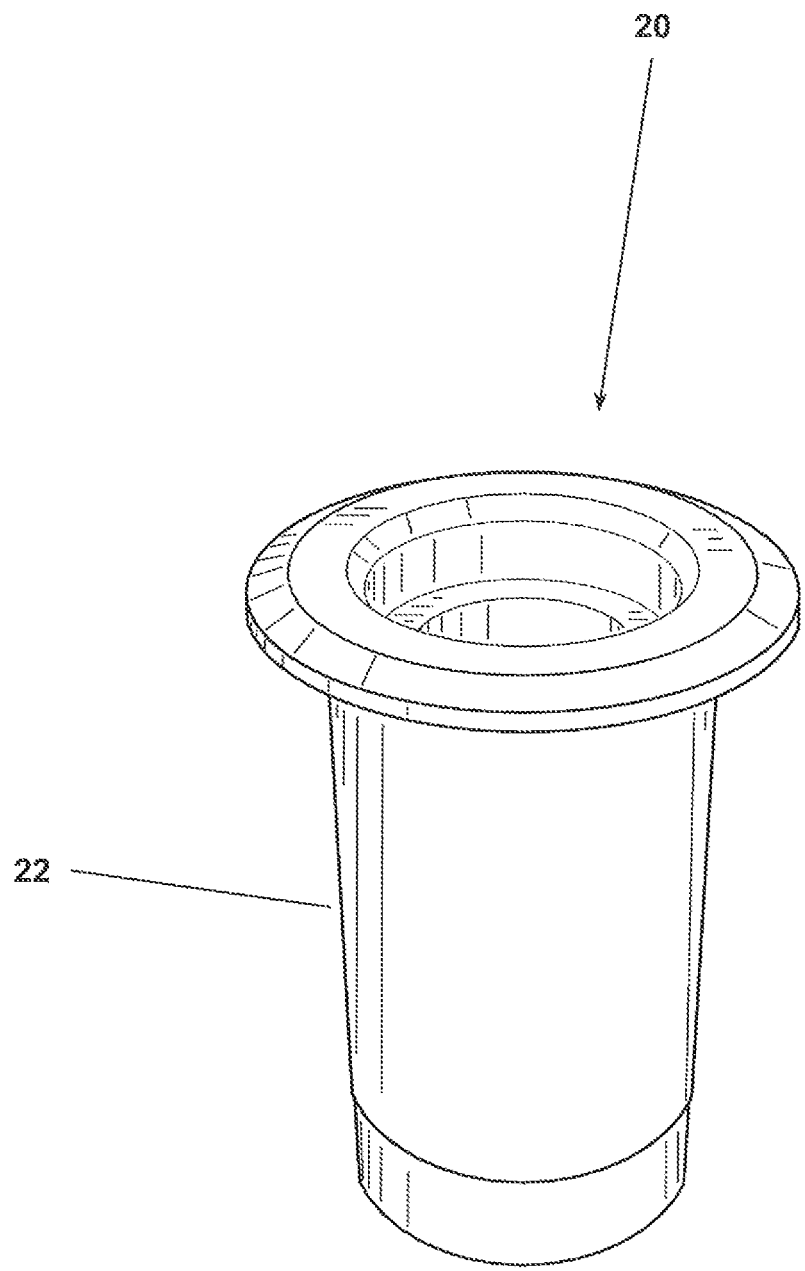
FIG. 4C is a side perspective view of the housing body of an embodiment of the multifunction touch-switch system.
Figure 4D:
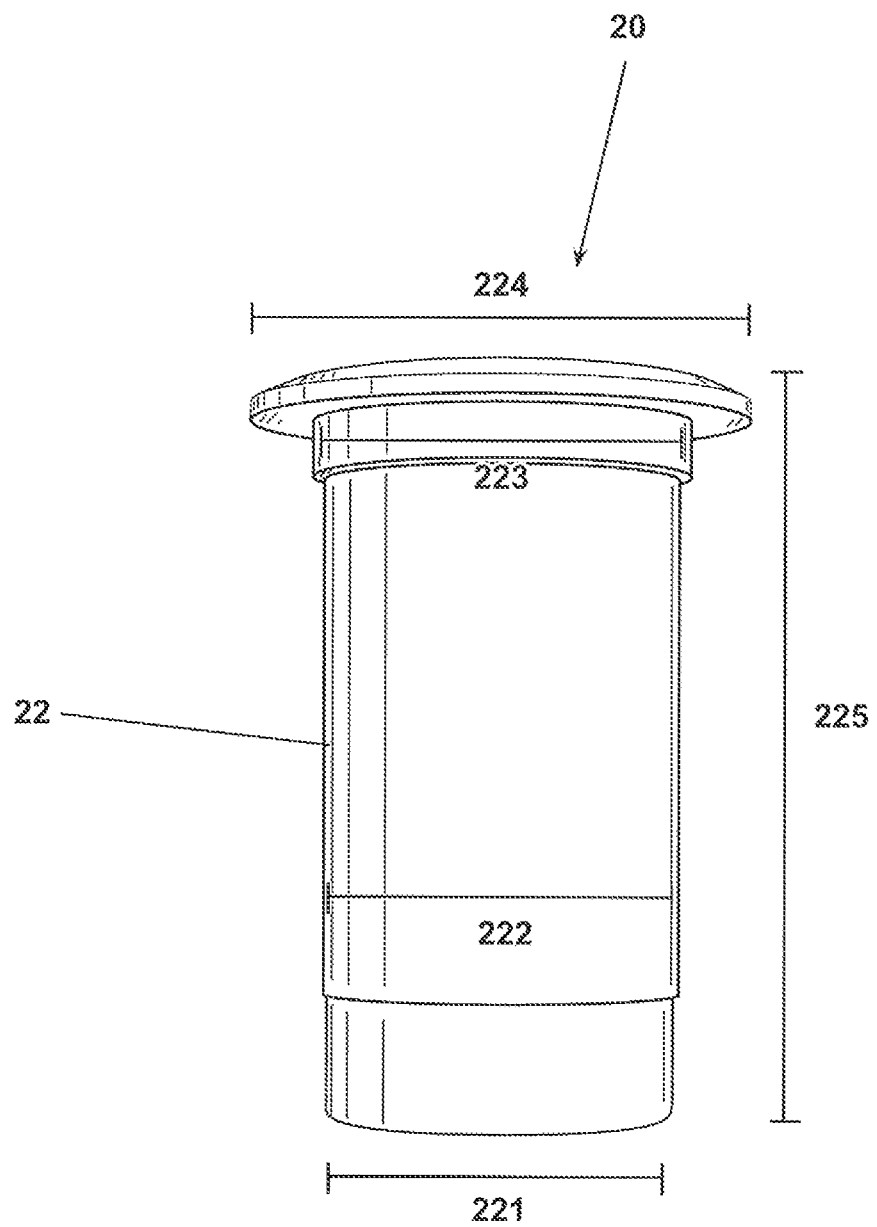
FIG. 4D is a side view of the housing body of an embodiment of the multifunction touch-switch system.

In some embodiments, the output rule 44 is implemented in the controller 10 by using a microcontroller 14, such as the one shown in FIG. 2. In some embodiments, the elements of the controller 10, including the microcontroller 14 may be connected through electrical connections on a PCB 16, as shown in FIGS. 2A and 2B. Other hardware and elements besides those specifically mentioned in this written specification may be included on the PCB 16, for example elements for reverse-polarity protection, for current overload protection, for voltage-limit protection, and/or for other purposes.

The housing 20 may be configured to protect the controller 10 from water, vibration, shock, or other damage. In some embodiments—as shown in FIGS. 1 and 5—the housing 20 may comprise a housing body 22. The housing body 22 may be shaped and dimensioned to receive a portion of the controller 10. As shown in FIGS. 1 and 5, the housing body 22 may be shaped and dimensioned such that the touch sensor 12, the microcontroller 14, and the PCB 16 all fit inside the housing body 22. In some embodiments, the housing 20 may further comprise a nut 24 and a washer 26. The housing body 22, nut 24, and washer 26 may be configured to mate securely together. For example, in some embodiments (as shown in FIG. 5), the housing body 22 and nut 24 may be configured with interlocking threads with a thread pitch, for example a thread pitch of approximately 19 millimeters. The housing body 22, nut 24, and washer 26 may be made of any suitable materials. In some embodiments, the housing body 22 may be made of stainless steel. In some embodiments, the nut 24 may be made of stainless steel; in some embodiments, the nut 24 may be made of nylon. In some embodiments, the washer 26 may be made of stainless steel; in some embodiments, the washer 26 may be made of silicone. The materials and mating of the housing 20, including the housing body 22, the washer 26, and the nut 24, may be chosen to provide a waterproof, watertight, or water-resistant protection to the controller.

In this disclosure, the terms waterproof, watertight, or water-resistant describe a system or device on which dripping water (vertically falling drops) shall have not harmful effect on the system or device when mounted in an upright position onto a turntable and rotated at 1 revolution per minute, i.e., equivalent to 1 millimeter of rainfall per minute, for 10 minutes. For example, the materials and mating may be chosen to satisfy the requirements to receive an Ingress Protection code of at least IP67. Ingress Protection codes are defined in International Electrotechnical ("IEC") standard 60529, for example IEC 60529:1989+AMD1:1999+AMD2:2013 CSV, including corrigenda at least through January 2019.

To achieve a degree of waterproofness, watertightness, or water-resistance, the washer 26 has a washer dash-face 261 and a washer nut-face 262 and the nut 24 has a nut washer-face 243 and a nut back-face 244. Further, a washer-dash gap 298 is defined between the washer dash-face 261 and the dash—in use the washer-dash gap 298 is reduced to zero. The material and dimension of the washer 26 are chosen to form a waterproof, watertight, or water-resistant contact between the washer-dash face 261 with the dash (see FIG. 6). As the nut 24 screws onto the threads of the housing body 22, the washer-dash gap 298 is reduced to zero and then the nut washer-face 243 is pushed against the washer nut-face 242 and the washer dash-face 241 is pushed against the dash. The opposing forces acting on the washer 24 tend to compress the washer 24, and the resulting stress reacts back from the washer dash-face 241 onto the dash to create a waterproof, watertight, or water-resistance contact between the washer dash-face 241 and the dash such that water does not pass between.

An example of a housing body 22 of one embodiment of the multifunction touch-switch system 2 is shown in FIGS. 4A-4D. As shown, the housing body 22 may have a shape which is roughly cylindrical and may be hollow to receive a portion of the controller 10. In the housing body 22 shown in FIGS. 4A-4D, the diameter of the housing body 22 is not constant throughout the length 225 of the housing body 22. In this particular example, the housing body 22 has a smallest diameter 221 at the bottom of the housing body 22, a number of intermediate diameters 222 and 223 over a number of portions of the housing body 22, and a cap diameter 224 at the top of the housing body 22. Such an embodiment may be configured, for example, to be inserted into a hole in a dashboard—the smallest diameter 221 and intermediate diameters 222 and 223 fitting inside such a hole, and the cap diameter 224 large enough to prevent the housing body from falling through such a hole. As shown in FIGS. 4A-6, the length over which the cap diameter 224 extends may be small enough that the housing sits approximately flush with the surface of a dashboard, for instance less than approximately 5 millimeters (mm).

In some embodiments, as shown in FIG. 5, the smallest diameter 221 may be approximately 17 mm and extend for approximately 6 mm of the length 225 of the housing body 22, the intermediate diameters may be approximately 18 mm and extend for a total of approximately 31 mm of the length 225 of the housing body 22, and the cap diameter may be approximately 25 mm and extend for approximately 2 mm of the length 225 of the housing body 22. As shown in FIG. 4, the length 225 of the housing body may be approximately 39 mm. Other dimensions, diameters, and lengths of the housing body 22 are possible. In some embodiments, the housing body 22 may be dimensioned both to receive a portion of the controller 10 and to be received by a hole in a dashboard, as shown for example in FIG. 6. Some embodiments of the multifunction touch-switch system 2 may be installed into a panel by inserting the housing body 22 into the panel from a first side (e.g., the front side) and affixing the nut 24 to the housing body 22 from a second side of the panel (e.g., the back side). In such an embodiment, as shown for instance in FIG. 6, a flange may further secure the multifunction touch-switch system 2 to the panel. In various embodiments, the panel may be a dash, dashboard or any other suitable panel.

Some embodiments of the multifunction touch-switch system 2 further comprise at least one indicator light 30. An indicator light 30 may be any suitable light device; for example, in some embodiments, an indicator light 30 is a light-emitting diode. An indicator light 30 may in some embodiments comprise one or more light devices (each possibly of one or more colors), for example multiple light-emitting diodes (LEDs). As shown in FIGS. 1 and 6, in some embodiments, an indicator light 30 may be positioned adjacent to the touch sensor 12. An indicator light 30 may in some embodiments provide information about the number of inputs (e.g., touches, taps, and tap-and-holds) which the touch sensor 12 has detected. In some embodiments, as depicted in FIG. 3, the indicator light 30 may have an associated indicator state 32 which is determined by the controller 10 according to an indicator rule 34. In some embodiments an indicator state 32 includes the state of the indicator light 30 being on or off. In some embodiments, an indicator state 32 includes the color of the indicator light 30. Similar to the above-disclosed output state 19 and output rule 44, an indicator rule 34 is a correlation of an indicator state 32 of an indicator light 30 with inputs to the touch sensor 12. An indicator rule 34 may be as simple or as complicated as necessary to achieve a desired overall function of the multifunction touch-switch system 2. In some embodiments, the indicator rule is implemented by the controller 10 using a microcontroller 14. In some embodiments, including an indicator light 30 may help overcome the design challenge of providing feedback to the user, possibly in the absence of tactile feedback from a moving switch or mechanical latch.

One example of an indicator rule 34 is shown in FIG. 3A. As shown in FIG. 3A, an indicator rule 34 may dictate that the indicator state 32 be such that: (1) the indicator light 30 is off when the resource is off; and (2) the indicator light 30 is on when the resource is on.

Another example of an indicator rule 34 is shown in FIG. 3B. As shown in FIG. 3B, an indicator rule 34 may dictate that the indicator state 32 be such that: (1) the indicator light 30 is off when all resources are off; and (2) the indicator light 30 is on when any resource is on, with the color of the indicator light 30 depending on the combination of resources which are on.

FIG. 9 shows a variety of other possible output rules 44 for a variety of possible resources: on-off; momentary on; dual device; bow-stern navigation-light pair, light; light controller; bilge pump; baitwell pump; baitwell time; and intermittent on. The disclosures herein of output rules 44 and indicator rules 34 is not intended to be exhaustive. The flexibility of the disclosed system in incorporating instructions embodying rules allows for a variety of rules to be implemented.

Figure 7A:
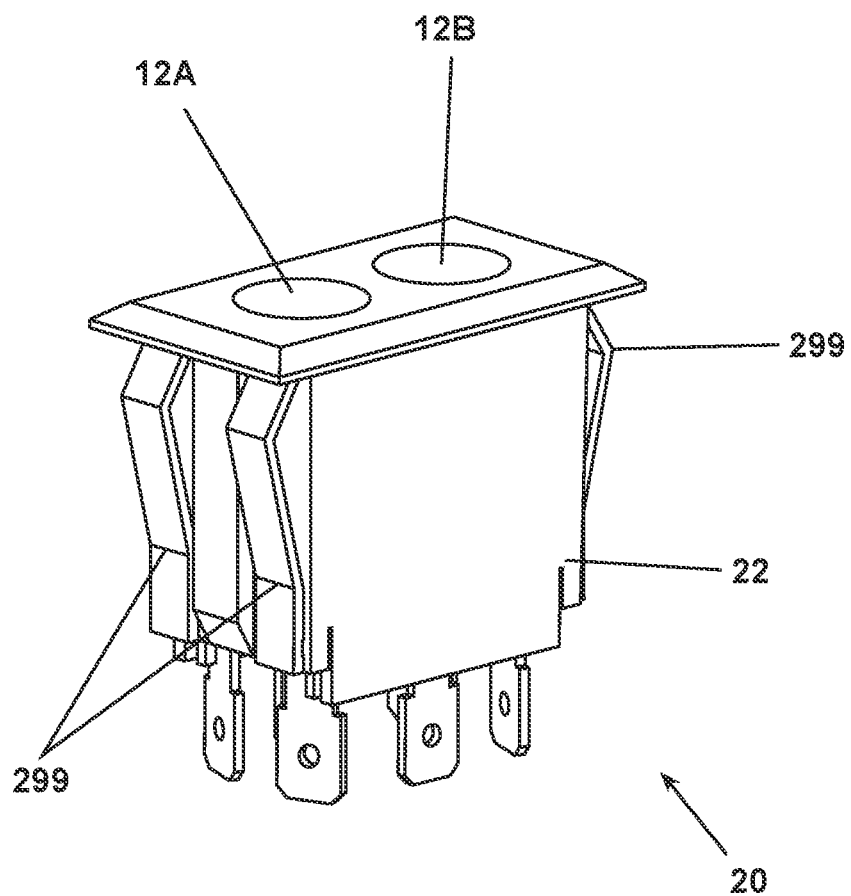
FIG. 7A is a side perspective view of the housing body of an embodiment of the multifunction touch-switch system.
Figure 7B:
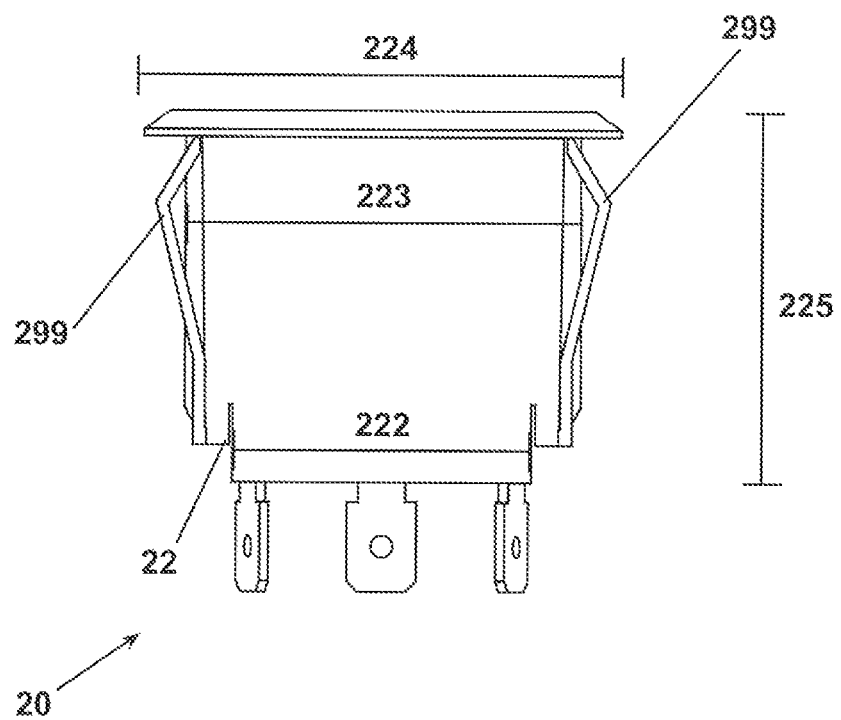
FIG. 7B is a side view of the housing body of an embodiment of the multifunction touch-switch system.

FIGS. 7A-7B show the housing body 22 of a multifunction touch-switch system 2 in accordance with some embodiments of the present disclosure. The housing body 22 has a rectangular top profile, which may be elongated in on direction to accommodate at least two touch sensors 12, for example a first touch sensor 12A and a second touch sensor 12B. The housing body 22 has a plurality of spring clips 299 configured to couple the housing body to a dashboard. A housing body 22 that is rectangular and accommodates two touch sensors 12A, 12B can emulate a traditional rocker switch.

FIG. 8 depicts an output rule 44 that could be implemented in a system 2 comprising two touch sensors 12A, 12B. The output rule 44 depicted in FIG. 8 determines an output state 19 according to which of the two touch sensors—either the first touch sensor 12A or the second touch sensor 12B—was most recently tapped.

In some embodiments a resource might have two states: "up" and "down." For example, an outboard motor could be a resource which might be trimmed between an "up" state and a "down" state. In such embodiments, the output rule 44 may dictate that the output state 19 be: (1) "up" when the most recently touched touch sensor is the first touch sensor 12A; and (2) "down" when the most recently touched touch sensor is the second touch sensor 12B.

In some embodiments a resource might have two states: "off" and "on," as described above. In such embodiments, the output rule 44 may dictate that the output state 19 be: (1) "on" when the most recently touched touch sensor is the first touch sensor 12A; and (2) "off" when the most recently touched touch sensor is the second touch sensor 12B.

In some embodiments a resource might be a bow-stern pair of navigation lights having two states: "bow" and "stern," depending on whether the bow-located navigation light or the stern-located navigation light is to be turned on. In such embodiments, the output rule 44 may dictate that the output state 19 be: (1) "bow" when the most recently touched touch sensor is the first touch sensor 12A; and (2) "stern" when the most recently touched touch sensor is the second touch sensor 12B.

FIG. 8 depicts an indicator rule 34 that could be implemented in a system 2 comprising two touch sensors 12A, 12B. The indicator rule 34 depicted in FIG. 8 determines indicator states 32 such that: (1) when the most recently touched sensor is the first touch sensor 12A, then a first indicator state is "on" and a second indicator state is "off"; and (2) when the most recently touched sensor is the second touch sensor 12B, then the first indicator state is "off" and the second indicator state is "on."

While the foregoing specification has described specific embodiments of this invention and many details have been put forth for the purpose of illustration or example, it will be apparent to one skilled in the art that the invention is susceptible to additional embodiments and that certain of the details described herein can be varied considerably without departing from the basic principles of the invention.

We claim:

1. A system comprising:
   a power supply;
   a waterproof housing body;
   a controller positioned substantially within the housing body,
      wherein the controller comprises a touch sensor, a microcontroller, a printed circuit board, and at least one output interface, and
      wherein the controller comprises instructions which, when executed by the controller, are configured to determine an output state of the at least one output interface,
         wherein the determination is made according to an output rule and based on an input to the touch sensor;
   wherein the controller is configured to be coupled to the power supply and to at least one output device to form an electrical circuit; and
   wherein the system has an Ingress Protection code of at least IP67.

2. The system of claim 1, wherein the housing body is threaded wherein the system further comprises:
   a nut; and
   a washer.

3. The system of claim 2, wherein the housing body is made of stainless steel, wherein the nut is made of nylon, and wherein the washer is made of thermoplastic rubber.

4. The system of claim 3, wherein the housing body has a thread pitch of approximately 19 millimeters.

5. The system of claim 1, wherein the controller is configured to be reverse-polarity protected, current-overload protected, and voltage-limit protected.

6. The system of claim 5,
   wherein the controller is configured to operate with a direct-current power supply of between 12 volts and 24 volts,
   wherein the controller is voltage-limit protected above 26 volts, and
   wherein the controller is current-overload protected above 7.4 amperes.

7. The system of claim 1, wherein the output rule involves a cycle of at least three inputs.

8. The system of claim 1, wherein the output rule involves a timer.

9. The system of claim 1, further comprising at least one indicator light.

10. The system of claim 9, wherein the at least one indicator light is a light-emitting diode.

11. The system of claim 9, wherein the controller comprises instructions which, when executed by the controller, are configured to determine an indicator state of each of the at least one indicator light,
   wherein the determination is made according to an indicator rule and based on an input to the touch sensor.

12. The system of claim 11, wherein the at least one indicator state comprises a color of an indicator light.

13. The system of claim 1, wherein the controller is power-side switched with respect to the touch sensor.

14. A system comprising:
   a power supply;
   a waterproof housing body having a plurality of spring clips;
   a controller positioned substantially within the housing body,
      wherein the controller comprises at least two touch sensors, a microcontroller, a printed circuit board, and at least one output interface, and
      wherein the controller comprises instructions which, when executed by the controller, are configured to determine an output state of the at least one output interface,
         wherein the determination is made according to an output rule and based on an input to the touch sensor;
   wherein the controller is configured to be coupled to the power supply and to at least one output device to form an electrical circuit; and
   wherein the system has an Ingress Protection code of at least IP67.

15. The system of claim 14, further comprising at least two indicator lights.

16. The system of claim 14, wherein the controller is configured to be reverse-polarity protected, current-overload protected, and voltage-limit protected.

17. A system, comprising:
   a multifunction touch switch comprising:
      a waterproof housing body;
      a controller positioned substantially within the housing body,
         wherein the controller comprises a touch sensor, a microcontroller, a printed circuit board, and at least one output interface, and
         wherein the controller comprises instructions which, when executed by the controller, are configured to determine an output state of the at least one output interface,
            wherein the determination is made according to an output rule and based on an input to the touch sensor;

at least one resource adapted to be coupled to the multifunction touch switch and to be controlled by an output interface according to its output state;

wherein the controller is configured to be coupled to a power supply and to at least one output device to form an electrical circuit; and wherein the system has an Ingress Protection code of at least IP67.

18. The system of claim 16, wherein the output rule involves a cycle of at least three inputs.

* * * * *